US011949401B2

(12) United States Patent
Jang et al.

(10) Patent No.: US 11,949,401 B2
(45) Date of Patent: Apr. 2, 2024

(54) FILM BULK ACOUSTIC RESONATOR PACKAGE WITH THIN FILM SEALING STRUCTURE AND MANUFACTURING METHOD THEREFOR

(71) Applicant: WISOL CO., LTD., Osan-si (KR)

(72) Inventors: Jin Nyoung Jang, Osan-si (KR); Ivoyl P Koutsaroff, Osan-si (KR)

(73) Assignee: WISOL CO., LTD., Osan-si (KR)

( * ) Notice: Subject to any disclaimer, the term of this patent is extended or adjusted under 35 U.S.C. 154(b) by 584 days.

(21) Appl. No.: 17/202,802

(22) Filed: Mar. 16, 2021

(65) Prior Publication Data

US 2022/0038072 A1  Feb. 3, 2022

(30) Foreign Application Priority Data

Jul. 30, 2020  (KR) .......................... 10-2020-0095230

(51) Int. Cl.
| | | |
|---|---|---|
| *H03H 9/17* | (2006.01) | |
| *H03H 3/02* | (2006.01) | |
| *H03H 9/05* | (2006.01) | |
| *H03H 9/10* | (2006.01) | |

(52) U.S. Cl.
CPC ............. *H03H 9/105* (2013.01); *H03H 3/02* (2013.01); *H03H 9/0514* (2013.01); *H03H 9/173* (2013.01); *H03H 2003/021* (2013.01)

(58) Field of Classification Search
CPC ....... H03H 9/105; H03H 9/0514; H03H 9/173
See application file for complete search history.

(56) References Cited

U.S. PATENT DOCUMENTS

| | | | | |
|---|---|---|---|---|
| 2007/0200146 A1* | 8/2007 | Onishi | ................. | H03H 9/0576 |
| | | | | 257/202 |
| 2016/0204761 A1* | 7/2016 | Lee | ..................... | H03H 9/0504 |
| | | | | 216/17 |
| 2018/0183406 A1* | 6/2018 | Patil | ....................... | H03H 9/173 |
| 2019/0019939 A1* | 1/2019 | Park | ...................... | H10N 30/20 |
| 2019/0140616 A1* | 5/2019 | Park | ......................... | H03H 3/02 |
| 2019/0245515 A1* | 8/2019 | Hurwitz | .................. | H03H 3/02 |

(Continued)

FOREIGN PATENT DOCUMENTS

| | | |
|---|---|---|
| JP | 2007-115825 A | 5/2007 |
| KR | 10-2005-0066104 A | 6/2005 |

(Continued)

OTHER PUBLICATIONS

KIPO Office Action, dated Mar. 15, 2022, for Korean Patent Application No. 10-2020-0095230 which corresponds to the above-identified U.S. application.

*Primary Examiner* — Bryan P Gordon
(74) *Attorney, Agent, or Firm* — LRK PATENT LAW FIRM (57) ABSTRACT

A method for manufacturing a film bulk acoustic resonator (FBAR) package with a thin film sealing structure includes: forming an FBAR having a bottom electrode, a piezoelectric layer, and a top electrode on a substrate; forming a plurality of inner pad electrodes electrically connected to the top electrode and the bottom electrode of the FBAR; attaching a PR (photo-resist) film to tops of the inner pad electrodes; etching the PR film to expose the inner pad electrodes to the outside; and forming a sealing layer on top of the PR film and tops of the exposed inner pad electrodes.

10 Claims, 9 Drawing Sheets

(56) References Cited

U.S. PATENT DOCUMENTS

2019/0379349 A1* 12/2019 Lee .................. H03H 9/105
2019/0393850 A1* 12/2019 Yong ................. H03H 3/08

FOREIGN PATENT DOCUMENTS

| KR | 10-2017-0024520 A | 3/2017 |
| KR | 10-2019-0008789 A | 1/2019 |
| KR | 10-2020-0000058 A | 1/2020 |
| KR | 10-2020-0007545 A | 1/2020 |

* cited by examiner

FILM BULK ACOUSTIC RESONATOR PACKAGE WITH THIN FILM SEALING STRUCTURE AND MANUFACTURING METHOD THEREFOR

CROSS-REFERENCE TO RELATED APPLICATION

The present application claims the benefit of Korean Patent Application No. 10-2020-0095230 filed in the Korean Intellectual Property Office on Jul. 30, 2020, the entire content of which is incorporated herein by reference.

BACKGROUND OF THE INVENTION

1. Field of the Invention

The present invention relates to a film bulk acoustic resonator (hereinafter referred to as "FBAR") package with a thin film sealing structure and a manufacturing method therefor, and more particularly, to an FBAR package with a thin film sealing structure and a manufacturing method therefor that are capable of having the thin film sealing structure, instead of a sealing structure formed by wafer level packaging in conventional practices, thereby remarkably reducing the entire package thickness.

2. Description of Related Art

As a need for miniaturization and high-density stacking of a small electronic device like a smartphone is greatly increasing, recently, surface-mount technology for an electronic element like a semiconductor integrated circuit (IC) is drastically evolved.

Instead of chip unit packaging, wafer level packaging (WLP) is introduced to remarkably decrease a packaging thickness, and a lamination substrate is adopted even in a printed circuit board to thus develop various materials, equipment and process technologies.

Packaging technology like the WLP is also introduced into the FBAR, so that the entire package thickness can be remarkably reduced.

Figure 11:
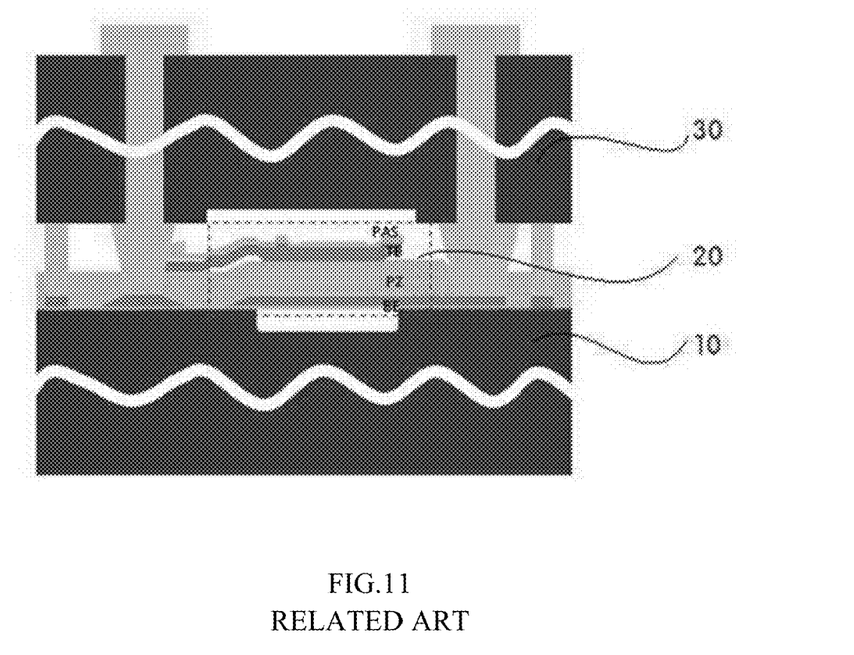
FIG. 11 is a sectional view showing a conventional FBAR package sealed by WLP.

FIG. 11 is a sectional view showing a conventional FBAR package, and the conventional FBAR package includes an FBAR 20 formed on top of a substrate 10 in such a manner as to be sealed by means of WLP 30.

Even if the conventional FBAR package as shown in FIG. 11 has a remarkably smaller thickness than an existing FBAR package, requirements that all of electronic devices used in modern life have to become light, thin, short and small are consistently suggested, and accordingly, a package structure and a manufacturing method in which the package has a smaller thickness than the package as shown in FIG. 11 are definitely needed.

Accordingly, there is a need for development of a new FBAR package structure that can have a smaller thickness than the conventional FBAR package using the WLP as shown in FIG. 11.

SUMMARY OF THE INVENTION

Accordingly, the present invention has been made in view of the above-mentioned problems occurring in the related art, and it is an object of the present invention to provide an FBAR package with a thin film sealing structure and a manufacturing method therefor that are capable of more reducing the entire package thickness when compared with the conventional FBAR package using the WLP.

It is another object of the present invention to provide an FBAR package with a thin film sealing structure and a manufacturing method therefor that are capable of improving water permeation prevention performance.

It is yet another object of the present invention to provide an FBAR package with a thin film sealing structure and a manufacturing method therefor that are capable of suppressing the formation of pin holes on a sealing layer thereof.

It is still another object of the present invention to provide an FBAR package with a thin film sealing structure and a manufacturing method therefor that are capable of efficiently utilizing an existing FBAR structure in the manufacturing process thereof.

To accomplish the above-mentioned objects, according to one aspect of the present invention, there is provided a method for manufacturing a film bulk acoustic resonator (FBAR) package with a thin film sealing structure, the method including the steps of: forming an FBAR having a bottom electrode, a piezoelectric layer, and a top electrode on a substrate; forming a plurality of inner pad electrodes electrically connected to the top electrode and the bottom electrode of the FBAR; attaching a PR (photo-resist) film to tops of the inner pad electrodes; etching the PR film to expose the inner pad electrodes to the outside; and forming a sealing layer on top of the PR film and tops of the exposed inner pad electrodes.

According to the present invention, desirably, the method further includes the step of etching the sealing layer disposed on the inner pad electrodes to form vias through which the inner pad electrodes are exposed to the outside again.

According to the present invention, desirably, the method further includes the step of forming insulating layers on the inner peripheral surfaces of the vias.

According to the present invention, desirably, the method further includes he step of forming outer pad electrodes on top of the sealing layer in such a manner as to be connected to the inner pad electrodes through the vias.

According to the present invention, desirably, the method further includes the step of forming an air cavity on the substrate before the FBAR is formed.

According to the present invention, desirably, the step of forming the sealing layer includes the step of stacking a plurality of thin film gas barriers.

According to the present invention, desirably, the method further includes, in the step of stacking the plurality of thin film gas barriers, the step of allowing the respective thin film gas barriers to be subjected to a surface treatment after stacked.

According to the present invention, desirably, the surface treatment is a plasma treatment using at least one of inert gases like helium (He), neon (Ne), argon (Ar), krypton (Kr), etc., $N_2$, $O_2$, $N_2O$, fluorine-containing gases, and chlorine-containing gases.

According to the present invention, desirably, the method further includes, after the last thin film gas barrier is stacked, the step of allowing the last thin film gas barrier to be subjected to a plasma surface treatment using gas containing hydrogen like $H_2$, $NH_3$, and so on.

According to the present invention, desirably, the method further includes, after the last thin film gas barrier is stacked, the step of allowing the last thin film gas barrier to be coated with a hydrophobic material.

To accomplish the above-mentioned objects, according to another aspect of the present invention, there is provided a film bulk acoustic resonator (FBAR) package including: a substrate; an FBAR formed on the substrate and having a bottom electrode, a piezoelectric layer, and a top electrode; a plurality of inner pad electrodes electrically connected to the top electrode and the bottom electrode of the FBAR; a PR (photo-resist) film supportedly located on tops of the inner pad electrodes; a sealing layer stackedly formed on top of the PR film; and outer pad electrodes connected to the inner pad electrodes through vias penetrating the PR film and the sealing layer.

According to the present invention, desirably, the sealing layer includes a plurality of thin film gas barriers.

According to the present invention, desirably, the method further includes a dam formed on the outsides of the inner pad electrodes to surround the entire package.

According to the present invention, desirably, the dam is made of the same material as the inner pad electrodes.

According to the present invention, desirably, the method further includes the dam supports the PR film and the sealing layer together at the same height as the inner pad electrodes.

According to the present invention, desirably, the method further includes an air cavity formed on the substrate under the bottom electrode.

According to the present invention, desirably, the method further includes a passivation layer formed on top of the top electrode.

According to the present invention, desirably, the last thin film gas barrier located on the topmost position of the plurality of thin film gas barriers is coated with a hydrophobic material.

According to the present invention, desirably, the sealing layer includes at least one metal thin film gas barrier, and the vias penetrating the PR film and the sealing layer include insulating layers formed on the inner peripheral surfaces thereof so as to connect the inner pad electrodes and the outer pad electrodes.

According to the present invention, desirably, the FBAR package further includes a plurality of FBARS and an inner pad electrode located between the outer pad electrodes in such a manner as to be not connected to any outer pad electrode on the section traversing at least two or more FBARs of the plurality of FBARS.

According to the present invention, desirably, at least neighboring thin film gas barriers of the plurality of thin film gas barriers are made of different kinds of materials from each other.

According to the present invention, desirably, the last thin film gas barrier of the plurality of thin film gas barriers has the highest degree of hydrophobicity.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE EMBODIMENTS

Now, an explanation on embodiments of the present invention will be given with reference to the attached drawings. Objects, characteristics and advantages of the present invention will be more clearly understood from the detailed description as will be described below and the attached drawings. Before the present invention is disclosed and described, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure.

In the description, when it is said that a part "includes" other elements, the part must include other components regardless of other parts, and it does not exclude addition of other components.

In the description, further, when it is said that one element is described as being "connected" to the other element, one element may be "directly connected" to the other element, but it should be understood that one element may be "indirectly" or "electrically connected" to the other element, while another element or device being present between the two elements.

In the description, when it is said that a layer (film), area, pattern or structure is located "on" or "under" a substrate, layer (film), area, pad, or pattern, it means that one member may come into contact with another member as well as yet another member may exist between the two members. Top and underside of the layer will be explained with reference to drawings.

The terms such as the first and the second may be used to only to distinguish a plurality of components, and the components should not be restricted as in orders and other characteristics.

The steps illustrated in the drawings are only sequence illustratively suggested, but other additional steps may be provided or some steps may be omitted.

Figure 1A:
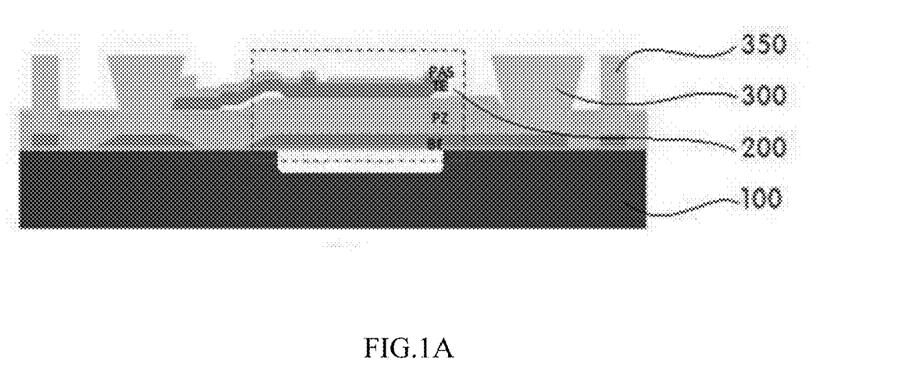
FIGS. 1A to 1F are sectional views showing the package shapes varied under a method for manufacturing an FBAR package with a thin film sealing structure according to the present invention.
Figure 1B:
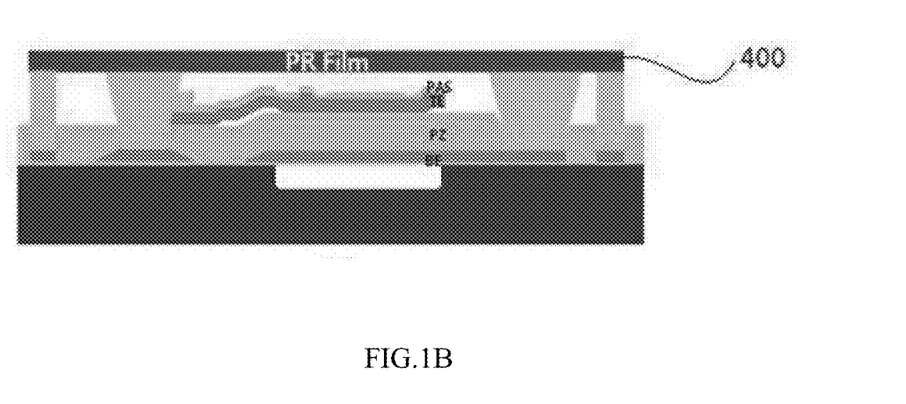
Figure 1C:
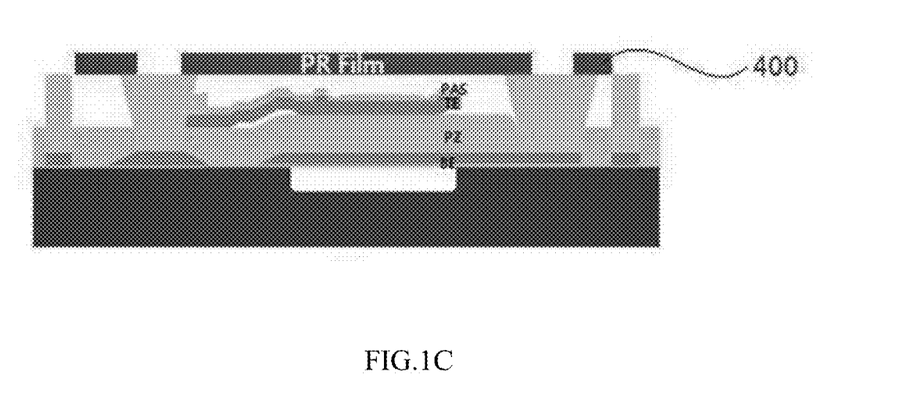
Figure 1D:
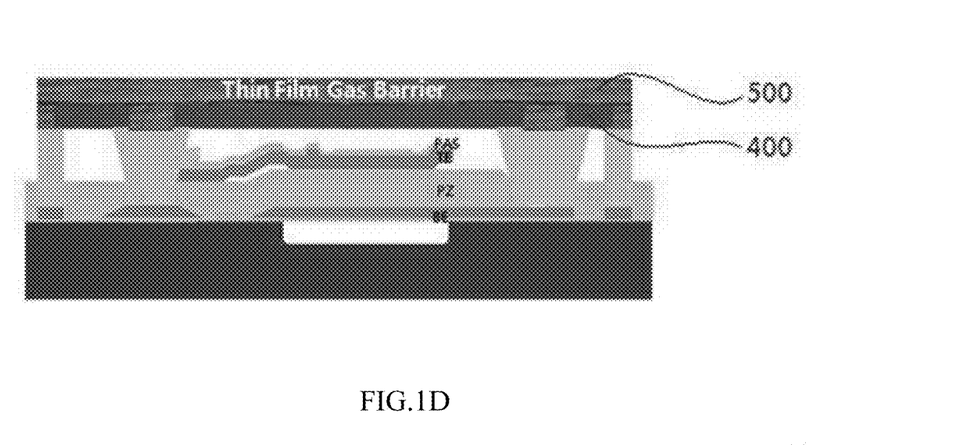
Figure 1E:
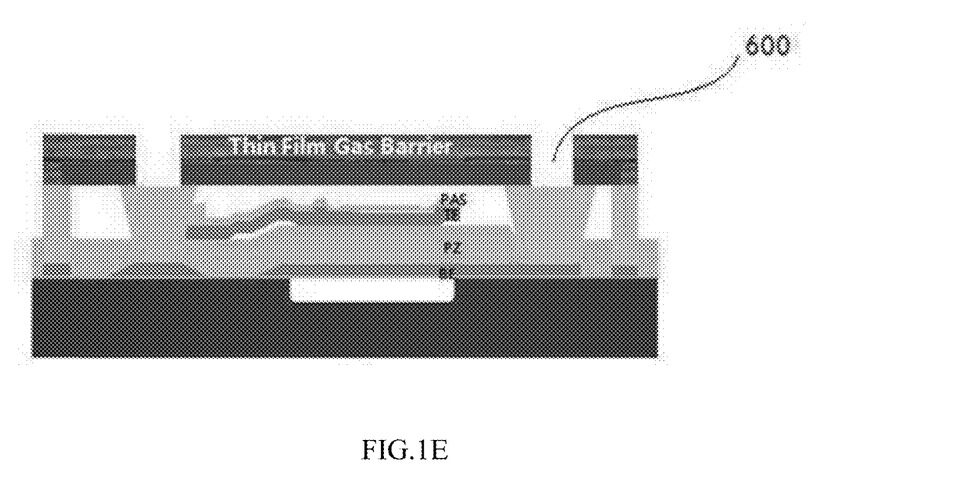
Figure 1F:
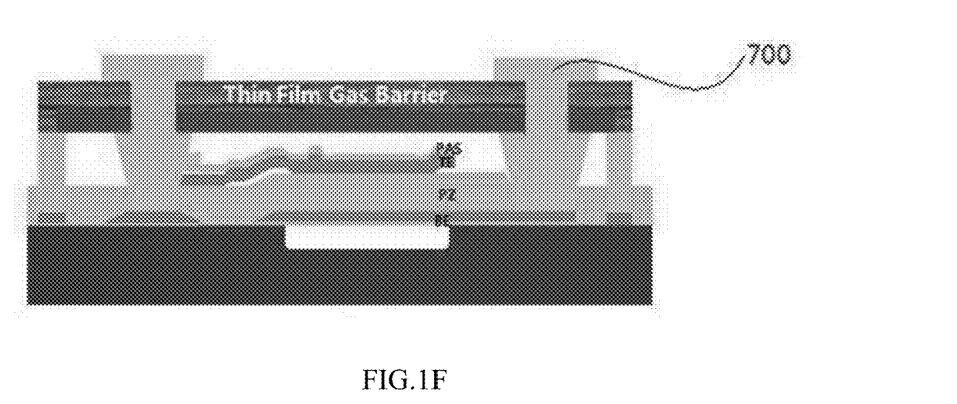
Figure 2:
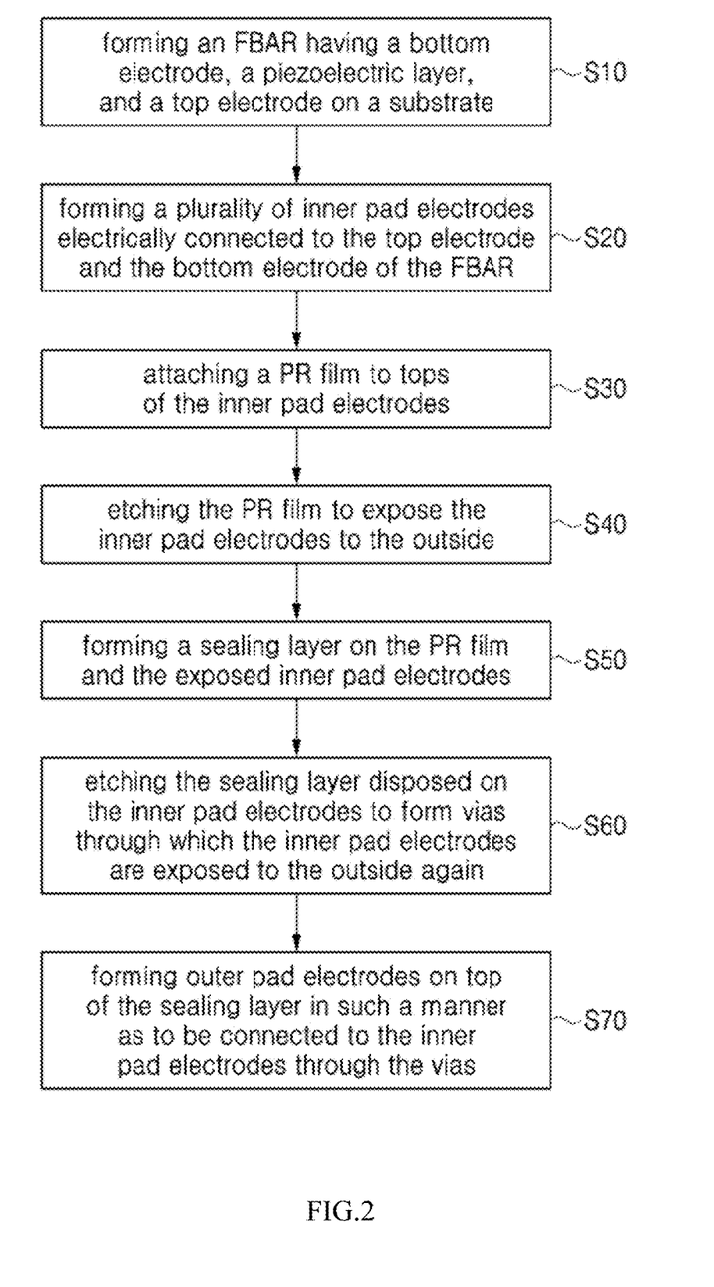
FIG. 2 is a flowchart showing steps of the method for manufacturing an FBAR package with a thin film sealing structure according to the present invention.

FIGS. 1A to 1F are sectional views showing the package shapes varied under a method for manufacturing an FBAR package with a thin film sealing structure according to the present invention, and FIG. 2 is a flowchart showing steps of the method for manufacturing an FBAR package with a thin film sealing structure according to the present invention.

Referring to FIGS. 1A to 2, a method for manufacturing an FBAR package with a thin film sealing structure according to the present invention will be explained.

FIG. 1A shows a first step of a method for manufacturing an FBAR package with a thin film sealing structure according to the present invention, and at this step, an FBAR 200 is formed on a silicon (Si) substrate 100 (step S10 of FIG. 2).

The method for manufacturing an FBAR package with a thin film sealing structure according to the present invention is the same as in the conventional practice until the FBAR is formed on the silicon substrate.

The FBAR 200, which includes a bottom electrode BE, a piezoelectric layer PZ, and a top electrode TE, is formed on the substrate 100.

Further, an air cavity is formed between the bottom electrode BE and the substrate 100, and a passivation layer PAS is formed on top of the top electrode TE.

Next, a plurality of inner pad electrodes 300 are formed to electrically connect the respective electrodes of the FBAR 200 thereto (step S20 of FIG. 2).

A dam 350 is formed on the outsides of the plurality of inner pad electrodes 300 to surround the entire package.

Since the inner pad electrodes 300 and the dam 350 are made of a metal component, they have high electrical conductivity so that they serve as electrical connection paths. Further, they serve as supports for supporting the package.

The inner pad electrodes 300 and the dam 350 are formed with the same process as each other.

After that, a PR (photo-resist) film 400 is attached to tops of the inner pad electrodes 300 (step S30 of FIG. 2). FIG. 1B shows the state where the PR film 400 is attached to tops of the inner pad electrodes 300.

For example, the PR film 400 is a film like a dry film resist which makes machining using a semiconductor process easy and has given strength, so that the PR film 400 serves as a structure for supporting a sealing layer 500 as will discussed later of the package.

After that, the PR film 400 disposed on tops of the inner pad electrodes 300 is etched to expose the inner pad electrodes 300 to the outside (step S40 of FIG. 2).

FIG. 1C shows the state where the step (step S40 of FIG. 2) is carried out.

Next, as shown in FIG. 1D, the sealing layer 500 is formed on tops of the exposed inner pad electrodes 300 and the PR film 400 (step S50 of FIG. 2).

The sealing layer 500 has a structure in which a plurality of thin films are stacked, and a specific explanation of the sealing layer 500 will be given later.

After that, as shown in FIG. 1E, the sealing layer 500 disposed on the inner pad electrodes 300 is etched to form vias 600 through which the inner pad electrodes 300 are exposed to the outside again (step S60 of FIG. 2).

The vias 600 serve as paths for electrically connecting a plurality of outer pad electrodes 700 as will be discussed later located on top of the sealing layer 500 to the inner pad electrodes 300 inside the sealing layer 500.

Next, as shown in FIG. 1F, the plurality of outer pad electrodes 700, which are connected to the inner pad electrodes 700 through the vias 600, are formed on top of the sealing layer 500 (step S70 of FIG. 2).

After the package is manufactured, the outer pad electrodes 700 serve to connect input and output signal lines or ground to the FBAR electrodes inside the package.

Figure 3:
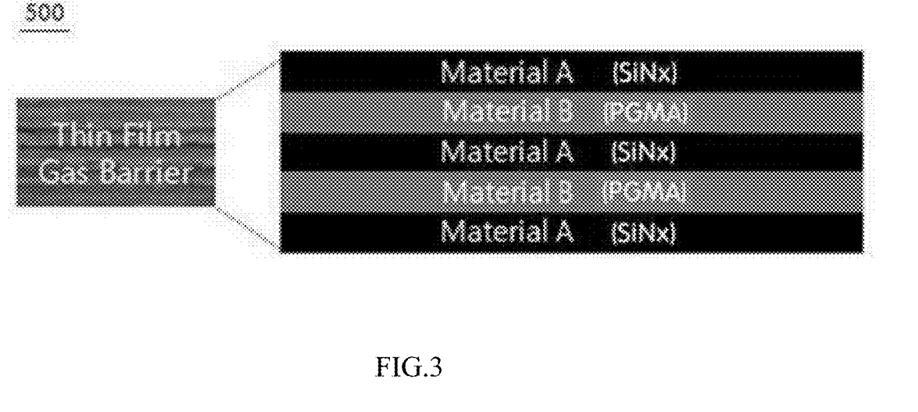
FIG. 3 is a sectional view showing a specific structure of a sealing layer in an FBAR package with a thin film sealing structure according to the present invention.

FIG. 3 is a sectional view showing a specific structure of the sealing layer 500 in the FBAR package with a thin film sealing structure according to the present invention.

Referring to FIG. 3, the sealing layer 500 in the FBAR package according to the present invention is formed by stacking a plurality of thin film gas barriers, and the thin film gas barriers are stacked on each other by means of various deposition methods like sputtering, evaporation, CVD (Chemical Vapor Deposition), ALD (Atomic Layer Deposition), and so on.

The thin film gas barriers are made of different kinds of materials from each other, and otherwise, at least neighboring thin film gas barriers are made of different kinds of materials having different characteristics from each other.

For example, the materials include organic substances like poly(glycidyl methacrylate) (PGMA) and poly(dimethylsiloxane) (PDMS), inorganic substances like SiNx, SiOx, SiC, AlOx, AlN, MgO, and various oxides and nitrides, metals like Mo, Cu, Al, Cr, and ITO, and other materials like silicon. FIG. 3 shows an example of the thin film gas barriers constituting the sealing layer 500, in which silicon nitride compounds and PGMA are alternately stacked on each other.

As mentioned above, the reason why the thin film gas barriers are stacked and are further made of different kinds of materials is to remove paths through which gas particles containing water enter the package from the outside or to form the paths that are very long and complicated if they are formed.

Figure 4A:
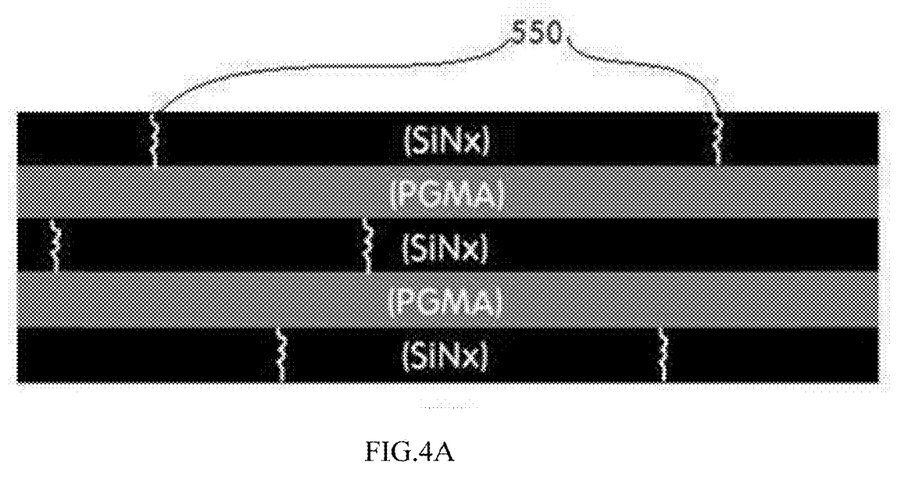
FIGS. 4A to 4C are sectional views showing the comparison in paths of gas particles entering the stacked barriers made of a single material and the stacked barriers made of different kinds of materials according to the present invention from the outside.
Figure 4B:
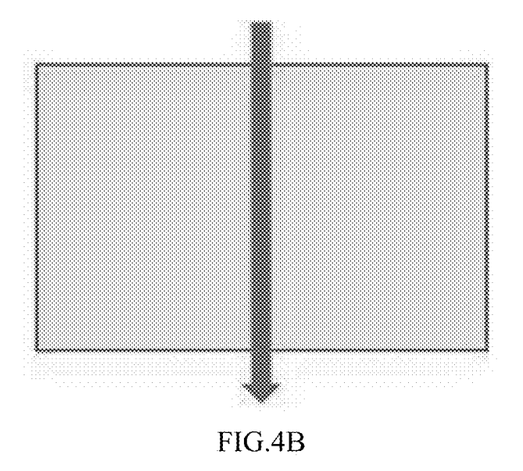
Figure 4C:
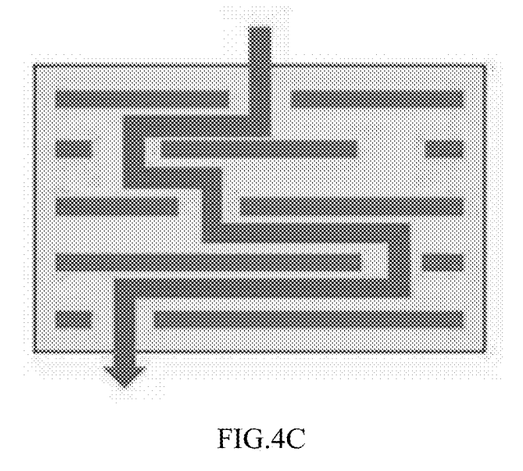

FIGS. 4A to 4C show the comparison in the paths of gas particles entering the stacked barriers made of a single or same kinds of materials and the stacked barriers made of different kinds of materials according to the present invention from the outside.

FIG. 4A shows pin holes 550 which are formed when different kinds of materials like the materials as shown in FIG. 3 are alternately deposited, and FIGS. 4B and 4C show the comparison in the paths of gas particles passing through the sealing layers from the outside when one sealing layer is formed of a single material and the other sealing layer is formed by stacking the thin film gas barriers made of different kinds of materials according to the present invention.

Even if pin holes are formed on any one thin film gas barrier, as shown in FIG. 4A, they may be cut, without being connected to the neighboring thin film gas barrier, through the alternating deposition of the different kinds of materials.

If the sealing layer 500 of the FBAR package is formed by stacking the different kinds of materials alternately, accordingly, the moving path of the gas particles invaded from the outside becomes very long, as shown in FIG. 4C, thereby effectively preventing the invasion of the external gas particles containing the water.

Figure 5:
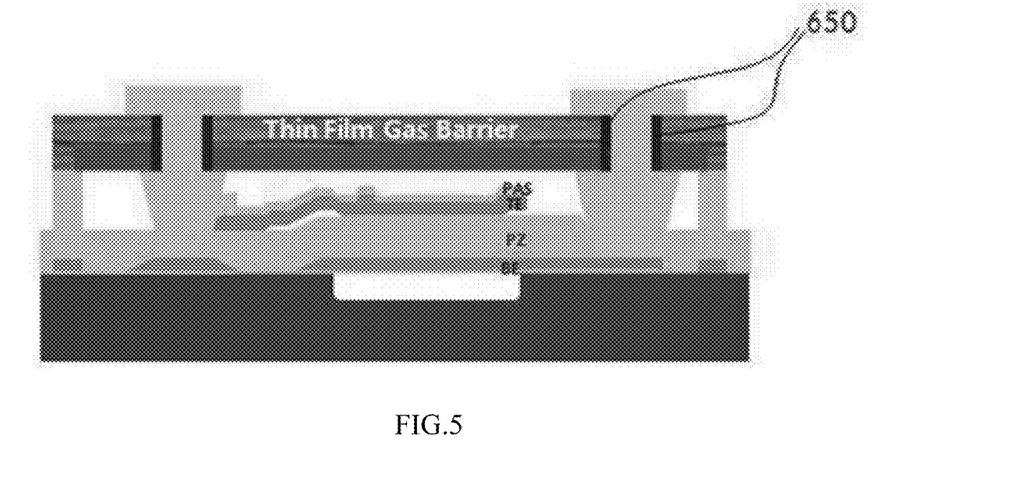
FIG. 5 is a sectional view showing a state in which insulating layers are formed on the inner peripheral surfaces of vias connecting inner pad electrodes and outer pad electrodes.

FIG. 5 shows insulating layers 650 formed on the inner peripheral surfaces of the vias 600 connecting the inner pad electrodes 300 and the outer pad electrodes 700.

If any one of the plurality of thin film gas barriers constituting the sealing layer 500 is made of a metal thin film gas barrier, as shown in FIG. 5, insulating layers 650 have to be additionally formed on the inner peripheral surfaces of the vias 600 so as to be insulated from the metal layer connecting the inner pad electrodes 300 and the outer pad electrodes 700.

In the process of depositing the plurality of thin film gas barriers constituting the sealing layer 500 according to the present invention, further, each thin film gas barrier is subjected to a plasma surface treatment.

The plasma surface treatment serves to suppress the formation of the pin holes after the thin film gas barriers have been formed and to enhance coupling forces between the neighboring thin film gas barriers, and the plasma surface treatment is carried out with the use of at least one or more gases selected from inert gases like helium (He), neon (Ne), argon (Ar), krypton (Kr), etc., $N_2$, $O_2$, $N_2O$, fluorine-containing gases, and chlorine-containing gases.

After the last topmost thin film gas barrier constituting the sealing layer 500 has been stacked, further, the last thin film gas barrier is subjected to a plasma surface treatment with gas containing hydrogen like $H_2$, $NH_3$, and so on, not with the gas used for the surface treatment as mentioned above. This is needed because the last thin film gas barrier has to have a hydrophobic surface, so that water permeation through the last thin film gas barrier can be prevented from the outside. The plasma surface treatment with gas containing hydrogen like $H_2$, $NH_3$, and so on can enhance the hydrophobicity on a material surface.

Another method for enhancing the hydrophobicity of the last thin film gas barrier is carried out by coating a hydrophobic material onto the surface of the last thin film gas barrier.

Figure 6:
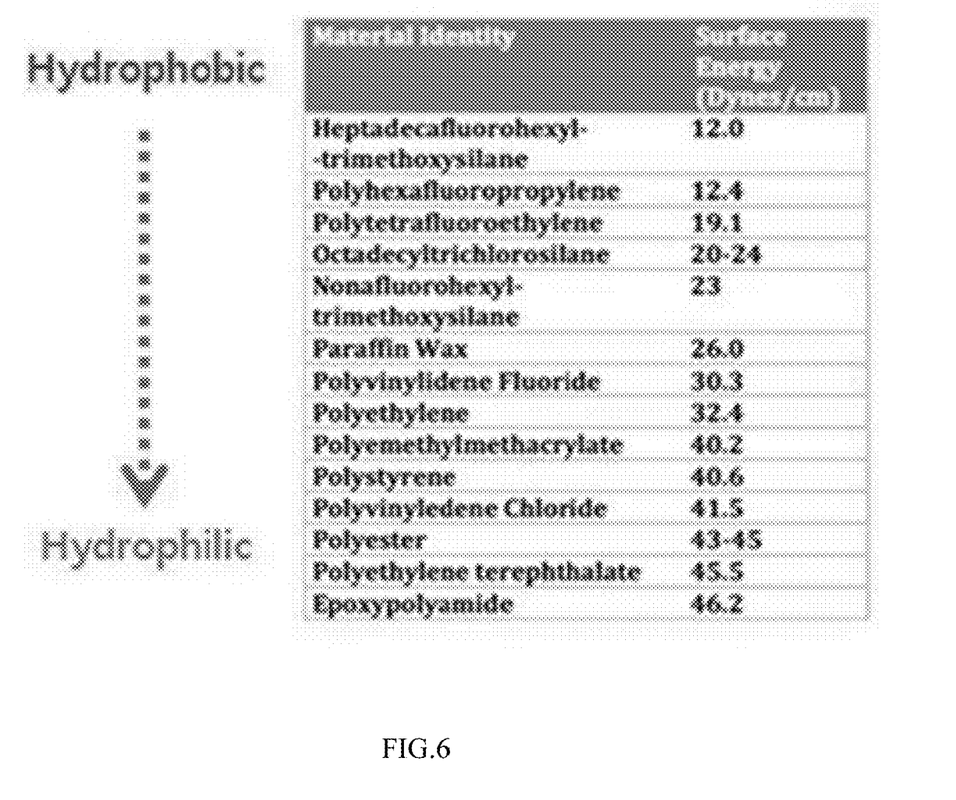
FIG. 6 is a table showing the degrees of hydrophobicity or hydrophilicity of various materials.

FIG. 6 is a table showing the arrangements of various materials having relatively strong degrees of hydrophobicity or hydrophilicity. According to the present invention, the materials arranged on the relatively upper sides of the table of FIG. 6 are coated onto the surface of the last thin film gas barrier so as to enhance the hydrophobicity of the last thin film gas barrier.

Figure 7:
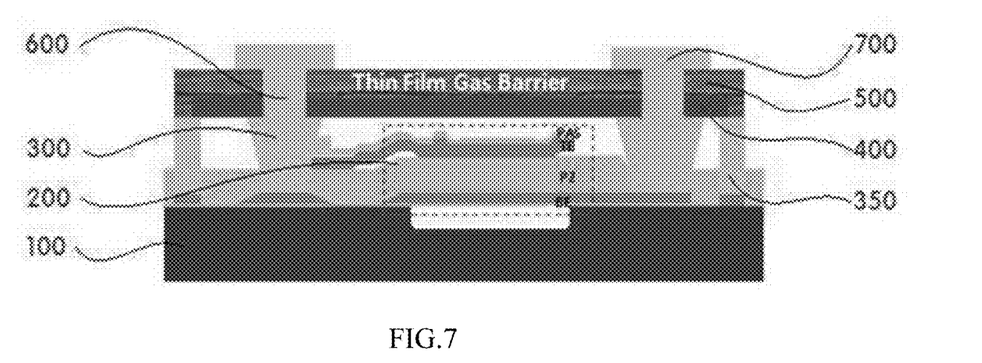
FIG. 7 is a sectional view showing the FBAR package with the thin film sealing structure manufactured by the manufacturing method according to the present invention.

FIG. 7 is a sectional view showing an FBAR package with a thin film sealing structure manufactured by the manufacturing method according to the present invention.

According to the present invention, an FBAR package with a thin film sealing structure includes a substrate 100, an FBAR 200 formed on top of the substrate 100 and having a bottom electrode, a piezoelectric layer, and a top electrode, a plurality of inner pad electrodes 300 electrically connected to the top electrode and the bottom electrode of the FBAR 200, a PR film 400 supportedly located on tops of the inner pad electrodes 300, a sealing layer 500 stackedly formed on the PR film 400, and outer pad electrodes 700 connected to the inner pad electrodes 300 through vias 600 penetrating the PR film 400 and the sealing layer 500.

Further, the FBAR package includes an air cavity formed on the substrate 100 under the bottom electrode and a passivation layer formed on top of the top electrode.

Also, the FBAR package includes a dam 350 formed surroundingly on the outside of the package in such a manner as to support the PR film 400 and the sealing layer 500.

The dam 350 supports the PR film 400 and the sealing layer 500 together at the same height as the inner pad electrodes 300.

The sealing layer 500 includes a plurality of thin film gas barriers, and at least neighboring thin film gas barriers are made of different kinds of materials from each other.

The last thin film gas barrier of the thin film gas barriers is made of a material having a higher degree of hydrophobicity than other thin film gas barriers, and otherwise, a material having a relatively higher degree of hydrophobicity may be coated onto the surface of the last thin film gas barrier.

The sealing layer 500 includes at least one metal thin film gas barrier, and in this case, insulating layers 650 are formed on the inner peripheral surfaces of the vias 600 penetrating the PR film 400 and the sealing layer 500 so as to connect the inner pad electrodes 300 and the outer pad electrodes 700.

Figure 8:
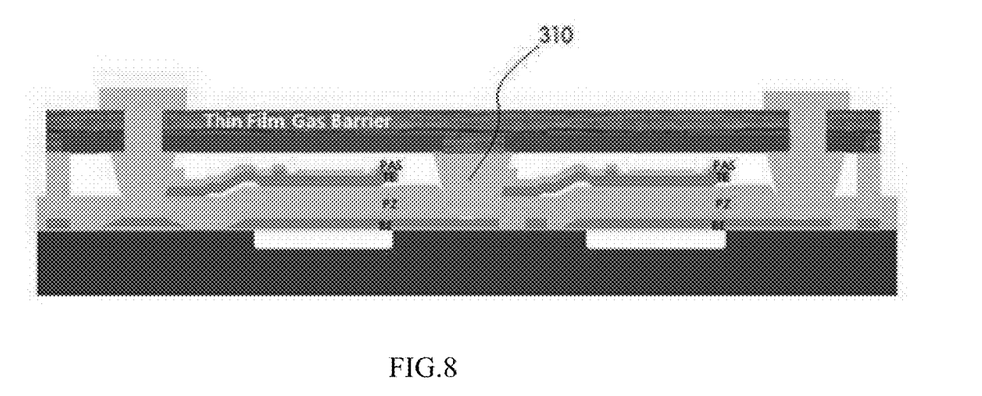
FIG. 8 is a sectional view showing an FBAR package according to another embodiment of the present invention, wherein a plurality of FBARs are located in the FBAR package.

FIG. 8 is a sectional view showing an FBAR package with a thin film sealing structure according to another embodiment of the present invention. In this case, the FBAR package includes a plurality of FBARs located thereon and an inner pad electrode 310 located between a plurality of outer pad electrodes in such a manner as to be not connected to any outer pad electrode.

As shown in FIG. 8, the two FBARs are located on the FBAR package, and the inner pad electrode 310, which is not connected to any outer pad electrode, is located between the two FBARs.

According to the present invention, as shown in FIG. 8, the FBAR package having the plurality of FBARS can use the inner pad electrode 310 not connected to any outer pad electrode as well as the inner pad electrodes 300 connected to the outer pad electrodes as supports for supporting the PR film 400 and the sealing layer 500 located thereon.

Figure 9A:
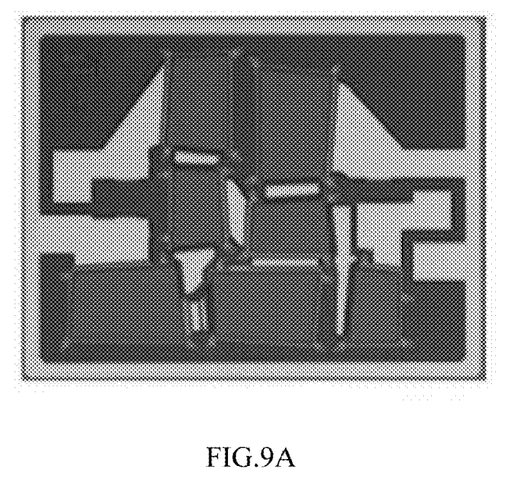
FIGS. 9A and 9B are top views showing metal layer areas and FBAR areas in the FBAR package having two or more FBARs.
Figure 9B:
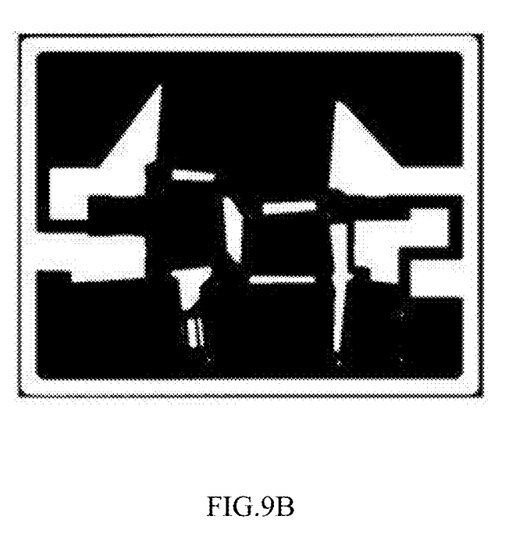

FIGS. 9A and 9B are top views showing metal layer areas and FBAR areas in the FBAR package having two or more FBARs.

In FIG. 9A, blue areas indicate areas in which the FBARs are located, and yellow areas indicate areas in which the metal layers are formed on the package.

In FIG. 9B, only the metal layers of FIG. 9A are indicated with white.

Referring to FIGS. 9A and 9B, it can be found that a lot of metal layers are formed between the FBARs of the FBAR package. According to the present invention, the FBAR package can ensure the support forces for the sealing layers that may relatively weaken as they are constituted of the thin film gas barriers, through the metal pad electrodes formed originally on the FBAR package. The FBAR package according to the present invention can still utilize the existing package structure, the existing manufacturing method, and the existing manufacturing equipment even if it has a new structure, thereby ensuring better competitiveness than the conventional FBAR package in view of a manufacturing cost.

In addition to the above advantages, the FBAR package with the thin film sealing structure, as shown in FIG. 7, has many advantages when compared with the conventional FBAR package.

Figure 10:
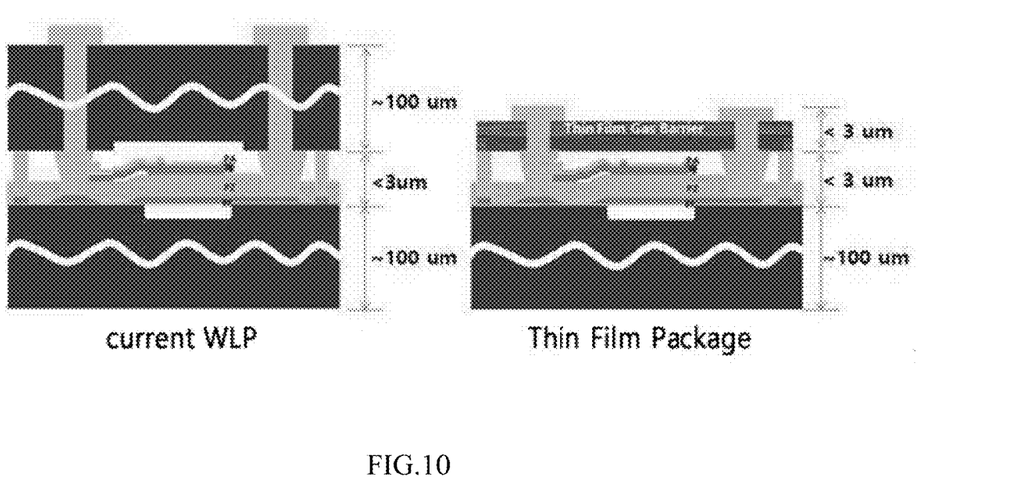
FIG. 10 is a sectional view showing the comparison between the FBAR package manufactured by the manufacturing method according to the present invention and the FBAR package manufactured by current WLP.

FIG. 10 is a sectional view showing the comparison between the FBAR package manufactured by the manufacturing method according to the present invention and the FBAR package manufactured by current WLP.

Referring to FIG. 10, in the case of the FBAR package manufactured by the current WLP, a WLP area for sealing on the upper side of the FBAR has a thickness of about 100 µm, and in the case of the FBAR package according to the present invention, a thickness of a sealing area is less than 3 µm, which is equal to a thickness of the FBAR package manufactured by the current WLP, which is made by almost removing the WLP area therefrom. Accordingly, the entire package thickness can be reduced to about ½.

As the thickness of the sealing layer is reduced by about 100 µm, the vias connecting the outer pad electrodes and the inner pad electrodes are remarkably decreased in length so that their resistance can be greatly reduced to permit heating suppression and more rapid radiation of heat generated therein to the outside. Also, even equipment where relatively high power has to be used does not have any problems that performance of the equipment is deteriorated due to heating and the structure of the equipment is complicatedly designed.

As described above, the FBAR package with the thin film sealing structure and the manufacturing method therefor according to the present invention can be manufactured to a thickness of ½ with respect to the thickness of the FBAR package manufactured by the current WLP and can utilize the existing package structure and manufacturing method to the maximum, while having many advantages from the thickness reduction, thereby ensuring better competitiveness than the conventional FBAR package in view of manufacturing easiness and manufacturing cost.

In specific, the present invention provides the FBAR package having a smaller thickness than that made by the conventional WLP, thereby reducing the entire package thickness.

In addition, the present invention can improve the water permeation prevention performance of the FBAR package.

Moreover, the present invention can suppress the formation of the pin holes on the sealing layer of the FBAR package.

Further, the present invention can efficiently utilize the existing FBAR structure in the process of manufacturing the FBAR package with the new sealing structure.

The preferred embodiments of the present invention have been disclosed in the specification and drawings. In the description of the present invention, special terms are used not to limit the present invention and the scope of the present invention as defined in claims, but just to explain the present invention.

Thus, although the invention has been described with respect to specific embodiments, it will be appreciated that the invention is intended to cover all modifications and equivalents within the scope of the following claims.

What is claimed is:

1. A film bulk acoustic resonator (FBAR) package with a thin film sealing structure, comprising:
    a substrate;
    an FBAR formed on the substrate and having a bottom electrode, a piezoelectric layer, and a top electrode;
    a plurality of inner pad electrodes electrically connected to the top electrode and the bottom electrode of the FBAR;
    a PR (photo-resist) film supportedly located on tops of the inner pad electrodes;
    a sealing layer stackedly formed on top of the PR film; and
    outer pad electrodes connected to the inner pad electrodes through vias penetrating the PR film and the sealing layer.

2. The FBAR package according to claim 1, wherein the sealing layer comprises a plurality of thin film gas barriers.

3. The FBAR package according to claim 1, further comprising a dam formed on the outsides of the inner pad electrodes to surround the entire package.

4. The FBAR package according to claim 3, wherein the dam is made of the same material as the inner pad electrodes.

5. The FBAR package according to claim 3, wherein the dam supports the PR film and the sealing layer together at the same height as the inner pad electrodes.

6. The FBAR package according to claim 2, wherein at least neighboring thin film gas barriers of the plurality of thin film gas barriers are made of different kinds of materials from each other.

7. The FBAR package according to claim 2, wherein the last thin film gas barrier of the plurality of thin film gas barriers has the highest degree of hydrophobicity.

8. The FBAR package according to claim 2, wherein the last thin film gas barrier located on the topmost position of the plurality of thin film gas barriers is coated with a hydrophobic material.

9. The FBAR package according to claim 2, wherein the sealing layer comprises at least one metal thin film gas barrier, and the vias penetrating the PR film and the sealing layer comprise insulating layers formed on the inner peripheral surfaces thereof so as to connect the inner pad electrodes and the outer pad electrodes.

10. The FBAR package according to claim 1, further comprising a plurality of FBARS and an inner pad electrode located between the outer pad electrodes in such a manner as to be not connected to any outer pad electrode on the section traversing at least two or more FBARs of the plurality of FBARs.

* * * * *